United States Patent
Sakurai et al.

(10) Patent No.: US 8,482,257 B2
(45) Date of Patent: Jul. 9, 2013

(54) BATTERY STATE MONITORING CIRCUIT AND BATTERY DEVICE

(75) Inventors: Atsushi Sakurai, Chiba (JP); Shohei Tsukamoto, Chiba (JP); Kazuaki Sano, Chiba (JP)

(73) Assignee: Seiko Instruments Inc., Chiba (JP)

( * ) Notice: Subject to any disclaimer, the term of this patent is extended or adjusted under 35 U.S.C. 154(b) by 465 days.

(21) Appl. No.: 12/898,981

(22) Filed: Oct. 6, 2010

(65) Prior Publication Data

US 2011/0089906 A1    Apr. 21, 2011

(30) Foreign Application Priority Data

Oct. 20, 2009    (JP) .................. 2009-241656

(51) Int. Cl.
| *H02J 7/00* | (2006.01) |
| *H02J 7/04* | (2006.01) |
| *H02J 7/16* | (2006.01) |

(52) U.S. Cl.
USPC ............ 320/134; 320/136; 320/150; 320/152

(58) Field of Classification Search
CPC ....................................................... Y02J 7/0031
USPC ......................................................... 320/134
See application file for complete search history.

(56) References Cited

FOREIGN PATENT DOCUMENTS
JP     2001-169463 A    6/2001

*Primary Examiner* — Edward Tso
*Assistant Examiner* — Ahmed Omar
(74) *Attorney, Agent, or Firm* — Brinks Hofer Gilson & Lione

(57) ABSTRACT

Provided are a battery state monitoring circuit with a small number of terminals and a battery device including the battery state monitoring circuit. An output of an overcharge detection circuit (12) is an open-drain output to a charge control terminal (18), and an input terminal of a voltage detection circuit (11) is connected to the charge control terminal (18), to thereby share a charger detection terminal and a charge control terminal.

5 Claims, 4 Drawing Sheets

BATTERY STATE MONITORING CIRCUIT AND BATTERY DEVICE

RELATED APPLICATIONS

This application claims priority under 35 U.S.C. §119 to Japanese Patent Application No. 2009-241656 filed on Oct. 20, 2009, the entire content of which is hereby incorporated by reference.

BACKGROUND OF THE INVENTION

1. Field of the Invention

The present invention relates to a battery state monitoring circuit for monitoring a battery state, and to a battery device.

2. Description of the Related Art

A conventional battery state monitoring circuit and a conventional battery device are described. FIG. 5 illustrates the conventional battery state monitoring circuit and the conventional battery device.

A battery 21 is connected to a power supply terminal 16 and a ground terminal 17 of a battery state monitoring circuit 1. A charger 31 is connected to an external power supply terminal 26 and an external ground terminal 27. A load 32 is connected to the external power supply terminal 26 and the external ground terminal 27. A charge control transistor 22 and a discharge control transistor 25 are connected between the external ground terminal 27 and the battery 21. A charger detection terminal 20 is connected to the external ground terminal 27 via a resistor 2.

The battery state monitoring circuit 1 monitors a voltage of the battery 21. When the voltage of the battery 21 is higher than an overcharge voltage, an overcharge detection circuit 12 outputs a signal for turning OFF the charge control transistor 22 to a charge control terminal 18. When the voltage of the battery 21 is lower than an overdischarge voltage, an overdischarge detection circuit 14 outputs a signal for turning OFF the discharge control transistor 25 to a discharge control terminal 19.

When the charger 31 is connected to the external power supply terminal 26 and the external ground terminal 27, a voltage of the charger detection terminal 20 becomes a negative terminal voltage of the charger 31, and a voltage detection circuit 11 can thus detect the connection of the charger 31. When the charger 31 is not connected to the external power supply terminal 26 and the external ground terminal 27, the voltage of the charger detection terminal 20 is pulled up by the load 32 and the resistor 2 to a positive terminal voltage VDD of the battery 21. This way, the voltage detection circuit 11 detects that the charger 31 is not connected (see, for example, Japanese Patent Application Laid-open No. 2001-169463).

The battery state monitoring circuit 1 detects the connection of the charger 31 in such a way to perform various kinds of state control.

However, the conventional battery state monitoring circuit 1 requires the charger detection terminal 20 in order to detect the connection of the charger 31. The battery device of FIG. 5 exemplifies the case of the single battery 21. But, if a plurality of the batteries 21 are connected in series, the number of terminals connecting to the batteries increases corresponding to the number of batteries. Because the battery state monitoring circuit 1 is sealed in a package, if the number of terminals of the battery state monitoring circuit 1 exceeds the number of terminals of the package even by one, there arises a problem that the battery state monitoring circuit 1 can no longer be sealed in the package. In other words, even one terminal is desired to be eliminated.

SUMMARY OF THE INVENTION

The present invention has been made in view of the above-mentioned problem, and therefore provides a battery state monitoring circuit with a small number of terminals and a battery device including the battery state monitoring circuit.

In order to solve the above-mentioned problem, the present invention provides a battery state monitoring circuit in which an output of an overcharge detection circuit is an open-drain output to a charge control terminal whereas an input terminal of a voltage detection circuit is connected to the charge control terminal to thereby enable the charge control terminal to serve also as a charger detection terminal, and further provides a battery device including the battery state monitoring circuit and a resistor for defining a voltage of the charge control terminal.

According to the battery state monitoring circuit of the present invention, the output of the overcharge detection circuit is the open-drain output to the charge control terminal, and the input terminal of the voltage detection circuit is connected to the charge control terminal, to thereby share the charger detection terminal and the charge control terminal, which enables to reduce the number of terminals.

DETAILED DESCRIPTION OF THE PREFERRED EMBODIMENTS

Now, referring to the accompanying drawings, an embodiment of the present invention is described below.

Figure 1:
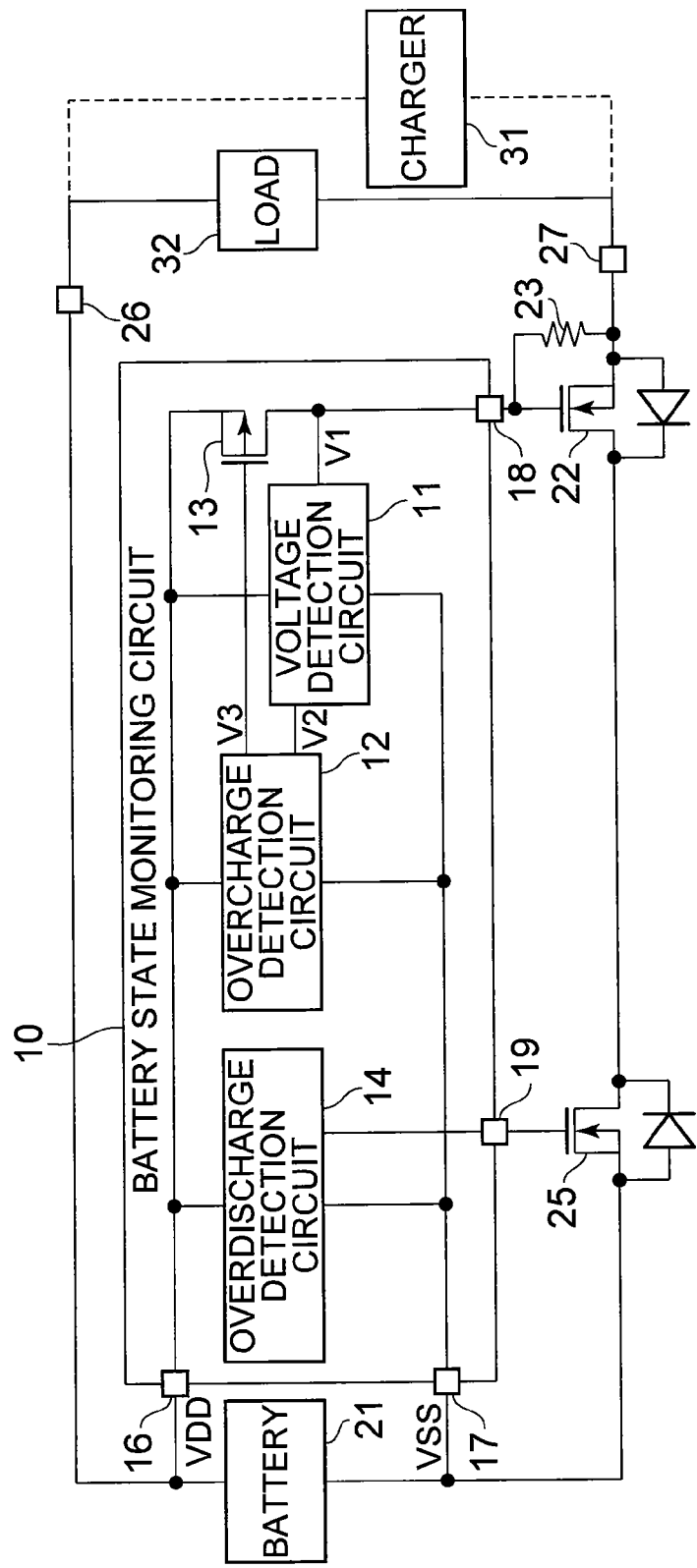
FIG. 1 is a block diagram illustrating a battery state monitoring circuit and a battery device according to the present invention.

FIG. 1 is a block diagram illustrating a battery state monitoring circuit and a battery device according to the present invention.

The battery device includes a battery 21, a battery state monitoring circuit 10, a charge control transistor 22, a resistor 23, a discharge control transistor 25, an external power supply terminal 26, and an external ground terminal 27.

The battery state monitoring circuit 10 includes a voltage detection circuit 11, an overcharge detection circuit 12, an output transistor 13, an overdischarge detection circuit 14, a power supply terminal 16, a ground terminal 17, a charge control terminal 18, and a discharge control terminal 19.

The battery 21 has a positive terminal connected to the power supply terminal 16 and the external power supply terminal 26, and a negative terminal connected to the ground terminal 17 and the external ground terminal 27 via the discharge control transistor 25 and the charge control transistor 22. The charge control transistor 22 has a gate connected to the charge control terminal 18, and a source and a back gate that are connected to the external ground terminal 27. The resistor 23 is connected between the charge control terminal 18 and the external ground terminal 27. The discharge control transistor 25 has a gate connected to the discharge control terminal 19, and a source and a back gate that are connected to the negative terminal of the battery 21.

The overcharge detection circuit 12 and the overdischarge detection circuit 14 are provided between the power supply terminal 16 and the ground terminal 17. An output terminal of the overcharge detection circuit 12 is connected to a gate of the output transistor 13. The output transistor 13 has a source connected to the power supply terminal 16 and a drain connected to the charge control terminal 18. In other words, the overcharge detection circuit 12 has an open-drain output to the charge control terminal 18. The voltage detection circuit 11 has an input terminal connected to the charge control terminal 18 and an output terminal connected to the overcharge detection circuit 12. An output terminal of the overdischarge detection circuit 14 is connected to the discharge control terminal 19.

Between the external power supply terminal 26 and the external ground terminal 27, a load 32 and a charger 31 are connected.

Figure 2:
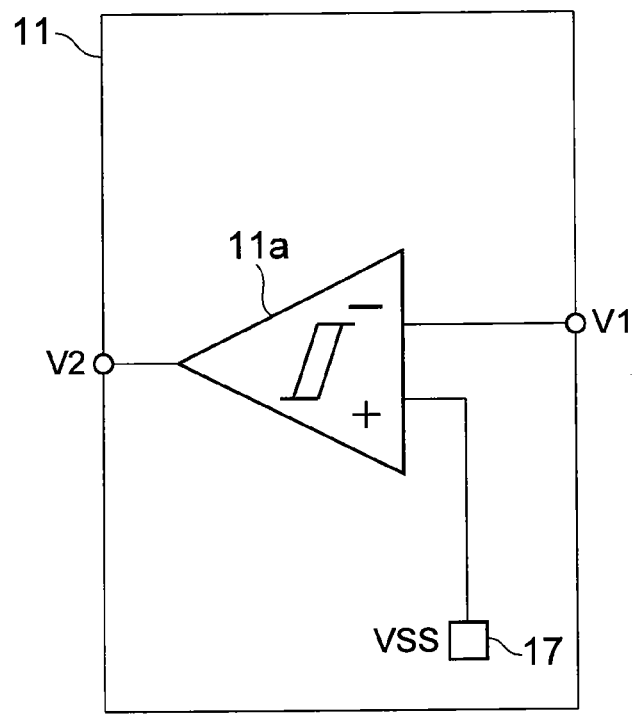
FIG. 2 is a circuit diagram illustrating an example of a voltage detection circuit included in the battery state monitoring circuit according to the present invention.
Figure 3:
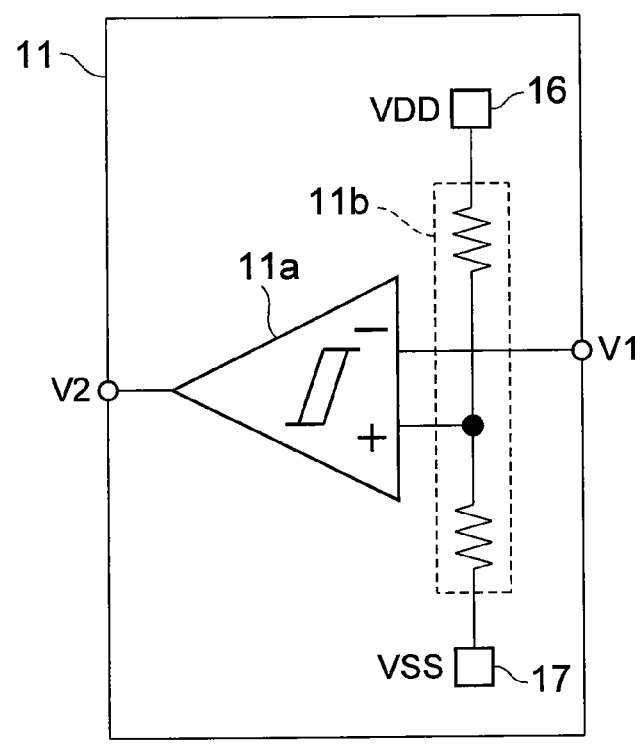
FIG. 3 is a circuit diagram illustrating another example of the voltage detection circuit included in the battery state monitoring circuit according to the present invention.

FIG. 2 is a circuit diagram illustrating an example of the voltage detection circuit 11 included in the battery state monitoring circuit according to the present invention. The voltage detection circuit 11 includes, for example, a hysteresis comparator 11a. The hysteresis comparator 11a has a non-inverting input terminal connected to the ground terminal 17, an inverting input terminal connected to the input terminal of the voltage detection circuit 11, and an output terminal connected to the output terminal of the voltage detection circuit 11. Alternatively, the voltage detection circuit 11 may have a circuit configuration illustrated in FIG. 3. The voltage detection circuit 11 of FIG. 3 further includes a voltage dividing circuit 11b that has an output terminal connected to the non-inverting input terminal of the hysteresis comparator 11a. The hysteresis comparator 11a compares a voltage V1 with a divided voltage of the voltage dividing circuit 11b.

Next, an operation of the battery state monitoring circuit and the battery device is described.

In a normal state in which a voltage of the battery 21 is lower than an overcharge voltage, the overcharge detection circuit 12 detects the voltage of the battery 21 being lower than the overcharge voltage, and outputs an output voltage V3 of Low from the output terminal thereof. The output transistor 13 is turned ON because the gate thereof is Low, and then the charge control terminal 18 becomes High. In the normal state, the charge control transistor 22 is thus turned ON. In this state, when the charger 31 is connected to the battery device, the battery 21 is charged by the charger 31.

When the battery 21 is charged by the charger 31, the battery 21 becomes an overcharge state in which the voltage thereof is higher than the overcharge voltage. The overcharge detection circuit 12 detects the voltage of the battery 21 being higher than the overcharge voltage, and outputs the output voltage V3 of High from the output terminal thereof. The output transistor 13 is turned OFF because the gate thereof is High. The charge control terminal 18 is pulled down by the resistor 23 to a negative terminal voltage of the charger 31, that is, to Low. The charge control transistor 22 is thus turned OFF to stop the charge of the battery 21 by the charger 31.

A voltage of the charger 31 is normally higher than the voltage of the battery 21, and hence the voltage V1 of the charge control terminal 18 is lower than a ground voltage VSS. Accordingly, in the hysteresis comparator 11a, the inverting input terminal is lower in voltage than the non-inverting input terminal and thus a voltage V2 of the output terminal is High. In other words, the voltage detection circuit 11 detects the connection of the charger 31 to change the voltage V2 to High.

Upon the input of the voltage V2 of High from the voltage detection circuit 11, the overcharge detection circuit 12 holds High of the voltage V3. Then, the charge control transistor 22 keeps being turned OFF. Therefore, even if the voltage of the battery 21 falls below an overcharge release voltage, the overcharge detection circuit 12 holds High of the voltage V3 as long as the charger 31 is connected, and hence the charge control transistor 22 keeps being turned OFF to inhibit the charge.

In this state, when the charger 31 is disconnected from the battery device, the external ground terminal 27 is pulled up by the load 32 and the resistor 23 to a positive terminal voltage VDD of the battery 21. Accordingly, in the hysteresis comparator 11a, the inverting input terminal becomes higher in voltage than the non-inverting input terminal and thus the voltage V2 of the output terminal becomes Low. In other words, the voltage detection circuit 11 detects the disconnection of the charger 31 to change the voltage V2 to Low. At this time, if the voltage of the battery 21 is below the overcharge release voltage, the overcharge detection circuit 12 outputs the voltage V3 of Low to turn ON the charge control transistor 22.

As described above, in the battery state monitoring circuit 10, the output of the overcharge detection circuit 12 is the open-drain output to the charge control terminal 18, and the input terminal of the voltage detection circuit 11 is connected to the charge control terminal 18, to thereby share a charger detection terminal and a charge control terminal, which enables to reduce the number of terminals.

Figure 4:
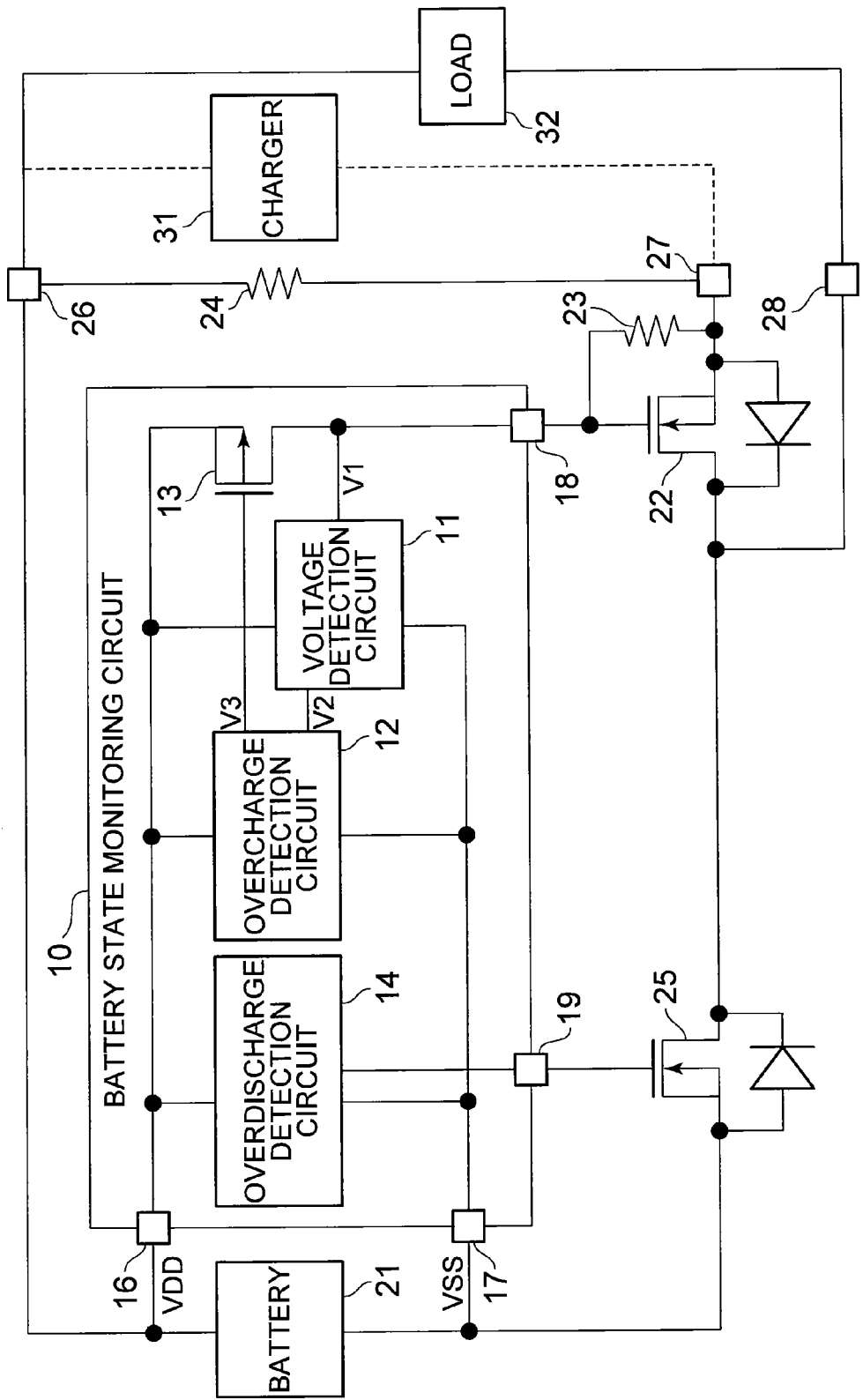
FIG. 4 is a block diagram illustrating another example of the battery device according to the present invention.
Figure 5:
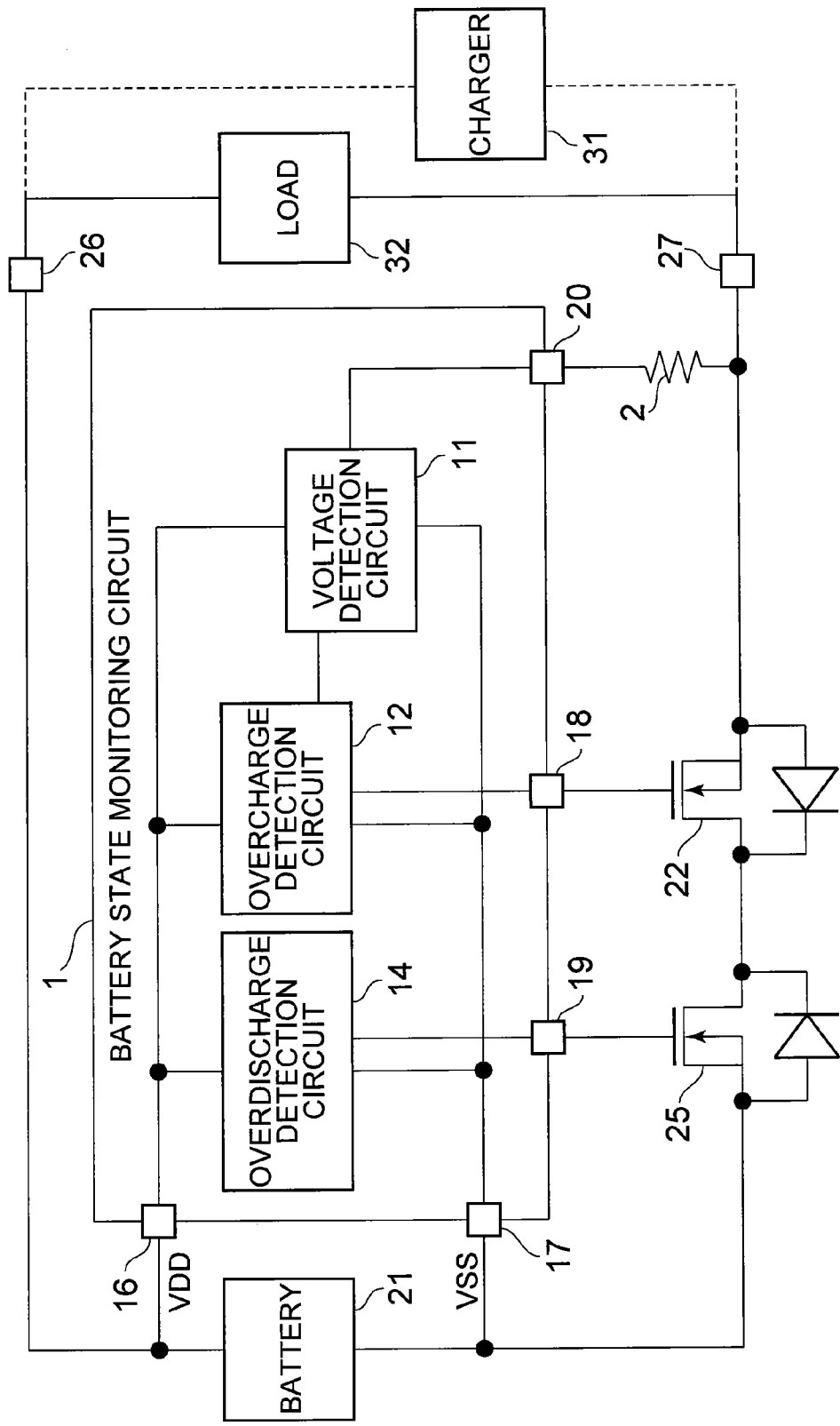
FIG. 5 is a block diagram illustrating a conventional battery state monitoring circuit and a conventional battery device.

FIG. 4 illustrates another example of the battery device according to the present invention. The battery device of FIG. 4 further includes an external load ground terminal 28. The external load ground terminal 28 is connected between the discharge control transistor 25 and the charge control transistor 22. Such a circuit configuration of the battery device is aimed at eliminating the influence of the charge control transistor 22 on a discharge path of the battery 21 to the load 32 when the charge control transistor 22 is turned OFF.

In the battery device with such a configuration, the load 32 is not connected between the external power supply terminal 26 and the external ground terminal 27, and hence the external ground terminal 27 cannot be applied with a voltage for detecting the disconnection of the charger 31. For that reason, as illustrated in FIG. 4, a resistor 24 is provided between the external power supply terminal 26 and the external ground terminal 27. The resistor 24 pulls up the external ground terminal 27 to the positive terminal voltage VDD of the battery 21. Note that, the same effect can also be obtained when the resistor 24 is connected between the power supply terminal 16 and the charge control terminal 18 inside the battery state monitoring circuit 10. In this case, there is another effect of reducing the number of components of the battery device.

Also in the battery device provided with the external load ground terminal 28, the above-mentioned configuration enables a charger detection terminal and a charge control terminal to be shared to reduce the number of terminals.

Note that, this embodiment exemplifies the battery device in which the charge control transistor 22 is provided between the external ground terminal 27 and the negative terminal of the battery 21, but the same holds true for a battery device in which the charge control transistor 22 is provided between the external power supply terminal 26 and the positive terminal of the battery 21. In this case, the charge control transistor 22 employs a PMOS transistor and the output transistor 13 employs an NMOS transistor.

What is claimed is:

1. A battery state monitoring circuit, comprising:
   an overcharge detection circuit for monitoring a voltage of a battery to detect an overcharge state of the battery;
   an output transistor controlled by an output signal of the overcharge detection circuit, which is turned OFF when the output signal is an overcharge state detected signal and is turned ON when the output signal is a normal state detected signal;
   a charge control terminal to be connected to a charge control transistor, from which a signal of the output transistor is output to the charge control transistor; and
   a voltage detection circuit for monitoring a voltage of the charge control terminal to detect connection of a charger.

2. A battery state monitoring circuit according to claim 1, wherein the output transistor has an open-drain output.

3. A battery device, comprising:
   a rechargeable/dischargeable battery;
   the battery state monitoring circuit according to claim 1, for monitoring a voltage of the rechargeable/dischargeable battery;
   a first external terminal and a second external terminal, between which a load and a charger are to be connected;
   a charge control transistor including:
       a gate connected to the charge control terminal; and
       a source and a drain that are connected to a charge/discharge path of the rechargeable/dischargeable battery; and
   a resistor provided between the gate and the source of the charge control transistor.

4. A battery device, comprising:
   a rechargeable/dischargeable battery;
   the battery state monitoring circuit according to claim 1, for monitoring a voltage of the rechargeable/dischargeable battery;
   a first external terminal to be connected to one terminal of a load and one terminal of a charger;
   a second external terminal to be connected to another terminal of the charger;
   a charge control transistor including:
       a gate connected to the charge control terminal; and
       a source and a drain that are connected to a charge/discharge path of the rechargeable/dischargeable battery;
   a first resistor provided between the gate and the source of the charge control transistor;
   a third external terminal connected to the drain of the charge control transistor and to be connected to another terminal of the load; and
   a second resistor provided between the first external terminal and the second external terminal.

5. A battery device according to claim 4, wherein the second resistor is provided between the charge control terminal of the battery state monitoring circuit and a first terminal of the rechargeable/dischargeable battery.

* * * * *